US008552759B2

(12) United States Patent
Wessels et al.

(10) Patent No.: US 8,552,759 B2
(45) Date of Patent: Oct. 8, 2013

(54) PROGRAMMABLE LOGIC BASED ON A MAGNETIC DIODE AND APPLICATIONS OF SAME

(75) Inventors: Bruce W. Wessels, Wilmette, IL (US); Nikhil Rangaraju, Elkgrove Village, IL (US)

(73) Assignee: Northwestern University, Evanston, IL (US)

( * ) Notice: Subject to any disclaimer, the term of this patent is extended or adjusted under 35 U.S.C. 154(b) by 0 days.

(21) Appl. No.: 13/528,505

(22) Filed: Jun. 20, 2012

(65) Prior Publication Data

US 2012/0306534 A1 Dec. 6, 2012

Related U.S. Application Data

(63) Continuation-in-part of application No. 13/401,581, filed on Feb. 21, 2012.

(60) Provisional application No. 61/498,998, filed on Jun. 20, 2011.

(51) Int. Cl.
*H03K 19/173* (2006.01)

(52) U.S. Cl.
USPC ............. 326/38; 326/124; 326/104; 326/133; 326/101

(58) Field of Classification Search
USPC ......... 326/104, 112, 115, 118, 119, 121, 122, 326/123, 124, 130–135
See application file for complete search history.

(56) References Cited

U.S. PATENT DOCUMENTS

| | | | |
|---|---|---|---|
| 7,956,608 B1 * | 6/2011 | Wessels et al. | 324/252 |
| 8,354,861 B2 * | 1/2013 | Sugibayashi et al. | 326/101 |
| 2006/0164124 A1 * | 7/2006 | Koch et al. | 326/104 |
| 2010/0039136 A1 * | 2/2010 | Chua-Eoan et al. | 326/38 |
| 2010/0225350 A1 * | 9/2010 | Hoeink et al. | 326/38 |
| 2011/0068825 A1 * | 3/2011 | Xi et al. | 326/47 |

OTHER PUBLICATIONS

Rangaraju, N. et al., Magnetoamplification in a Bipolar Magnetic Junction Transistor, Phys. Rev. Lett., 2010, vol. 105, 117202-1.
Rangaraju, N. et al., Giant Magnetoresistance of Magnetic Semiconductor Heterojunctions, Phys. Rev. B., 2009, vol. 79, 205209-1.
Ney, A. et al., Programmable Computing With a Single Magnetoresistive Element, Nature, 2003, vol. 425, 485.
McCray, W.P., How Spintronics Went From the Lab to the iPod, Nat. Nanotechnol., 2009, vol. 4, 2.
Dery, H. et al., Spin-Based Logic in Semiconductors for Reconfigurable Large-Scale Circuits, Nature, 2007, vol. 447, 573.
Wessels, B.W., Ferromagnetic Semiconductors and the Role of Disorder, New J. Phys., 2008, vol. 10, 055008.

(Continued)

*Primary Examiner* — Jany Richardson
(74) *Attorney, Agent, or Firm* — Morris, Manning & Martin, LLP; Tim Tingkang Xia, Esq.

(57) ABSTRACT

In one aspect, the invention relates to programmable logic that utilizes one or more of magnetic diodes. By changing magnetic fields generated in the magnetic diodes due to input signals, the programmable logic can be changed from one logic gate to another logic gate. The unique feature leads to field reprogrammable logic devices in which simple instructions can be used to construct a whole new set of logic gates.

31 Claims, 5 Drawing Sheets

(56) References Cited

OTHER PUBLICATIONS

I. Zutic et al., Spintronics: Fundamentals and applications, Rev. of Mod. Phys., 76, 2, 323-410 (2004).
D. D. Awschalom et al., Challenges for semiconductor spintronics, Nat. Phys., 3, 153-159 (2007).
C. Chapped et al., The emergence of spin electronics in data storage, Nature Materials, 6, 813-823 (2007).
I. Appelbaum et al., Electronic measurement and control of spin transport in silicon, Nature, 447, 295-298 (2007).
B. Q. Huang et al., 35% magnetocurrent with spin transport through Si, Appl. Phys. Lett., 91, 052501 (2007).
T. Dietl et al., Ferromagnetic Semiconductor Heterostructures for Spintronics, IEEE Trans. on Electron Devices, 54, 5, 945-954 (2007).
N. Lebedeva et al., Modeling of ferromagnetic semiconductor devices for spintronics, J. of Appl. Phys., 93, 12, 9845-9864 (2003).
J. Fabian et al., Spin transport in inhomogeneous magnetic fields: A proposal for Stern-Gerlach-like experiments with conduction electrons, Phys. Rev. B, 66, 024436 (2002).
R. R. Pela et al., Simulation of a spintronic transistor: A study of its performance, J. Magn. Magn. Mater., 321, 984-989 (2009).
I. Zutic et al., Bipolar spintronics: Fundamentals and applications, IBM, J. of Res. And Dev., 50, 1, 121 (2006).
J. May et al., High-field magnetoresistance in p-(In, Mn)As/n-InAs heterojunctions, Appl. Phys. Lett., 88, 072105 (2006).
P. T. Chiu et al., Dependence of magnetic circular dichroism on doping and temperature in In1-xMnxAs, Phys. Rev. B, 76, 165201 (2007).
J. Fabian et al., Magnetic bipolar transistor, Appl. Phys. Lett., 84, 1, 85-87 (2004).
J. Fabian et al., The Ebers-Moll model for magnetic bipolar transistors, Appl. Phys. Lett., 86, 133506 (2005).
S. M. Sze et al., Physics of Semiconductor Devices (Wiley-Interscience, 2007).
G. W. Neudeck, The Bipolar Junction Transistor, Modular series on solid state devices (Addison-Wesley Publishing Company, Inc., 1989), vol. III.
Meindl, J.D. et al., Limits on Silicon Nanoelectronics for Terascale Integration, Science, 2001, vol. 293, 2044-2049.
Frank, D.J. et al., Device Scaling Limits of Si MOSFETs and Their Application Dependencies, Proc. IEEE, 2001, vol. 89, 259-288.
Bernstein, K. et al., Device and Architecture Outlook for Beyond Cmos Switches, Proc. IEEE, 2010, vol. 98, 2169-2184.
Chen, R.N. et al., Singleelectron Transistor Logic, Appl. Phys. Lett., 1996, vol. 68, 1954-1956.
Bachtold, Adrian et al., Logic Circuits with Carbon Nanotube Transistors, Science, 2001, vol. 294, 1317-1320.
Geim, A.K. et al., The Rise of Graphene, Nature Materials, 2007, vol. 6, 183-191.
Liao, L. et al., High Speed Graphene Transistors with a Self-Aligned Nanowire Gate, Nature, 2010, vol. 467, 305-308.
Huang, Yu et al., Logic Gates and Computation from Assembled Nanowire Building Blocks, Science, 2001, vol. 294, 1313-1317.
Collier, C.P. et al., Electronically Configurable Molecular-Based Logic Gates, Science, 1999, vol. 285, 391-394.
Datta, S. et al., Electronic Analog of the Electrooptic Modulator, Appl. Phys. Lett., 1990, vol. 56, 665-667.
Amlani, I. et al., Digital Logic Gate Using Quantum-Dot Cellular Automata, Science, 1999, vol. 284, 289-291.
Allwood, D.A. et al., Magnetic Domain-Wall Logic, Science, 2005, vol. 309, 1688-1692.
Khitum, A. et al., Nano Scale Computational Architectures with Spin Wave Bus, Superlattices and Microstructures, 2005, vol. 38, 184-200.
Imre, A. et al., Majority Logic Gate for Magnetic Quantum-Dot Cellular Automata, Science, 2006, vol. 311, 205-208.
Sugahara, S. et al., Spin-Transistor Electronics: An Overview and Outlook, Proc. IEEE, 2010, vol. 98, 2124-2154.
Wolf, S.A. et al., The Promise of Nanomagnetics and Spintronics for Future Logic and Universal Memory, Proc. IEEE, 2010, vol. 98, 2155-2168.
Peters, J.A. et al., Spin-Dependent Magnetotransport in a p-InMnSb/n-InSb Magnetic Semiconductor Heterojunction Heterojunction, Appl. Phys. Lett., 2011, vol. 98, 193506.
Zutic, I. et al., Spin-Polarized Transport in Inhomogeneous Magnetic Semiconductors: Theory of Magnetic/Nonmagnetic p-n. Junctions, Phys. Rev. Lett., 2002, vol. 88, 066603.
Sklansky, J., Conditional-Sum Addition Logic, IRE Transactions on Electronic Computers, 1960, vol. 9, 226-231.
Katz, R.N., Contemporary Logic Design, (Benjamins/Cummings, Redwood City, CA 1994) 669-670.

\* cited by examiner

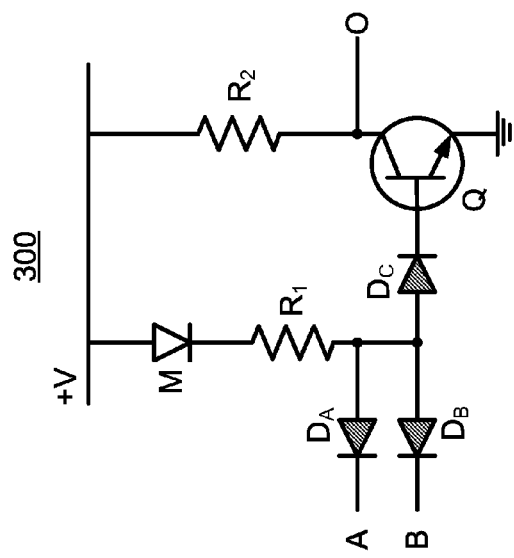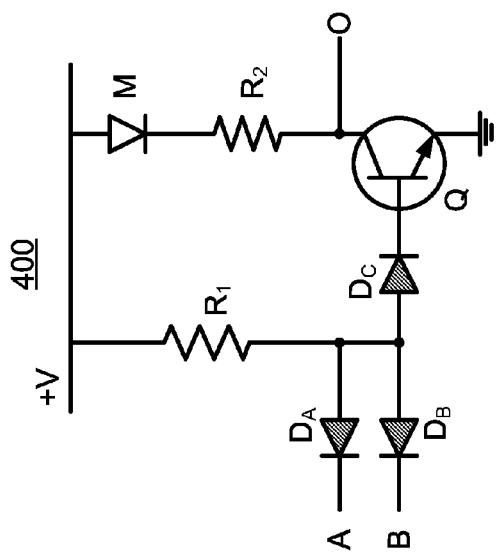

PROGRAMMABLE LOGIC BASED ON A MAGNETIC DIODE AND APPLICATIONS OF SAME

CROSS-REFERENCE TO RELATED PATENT APPLICATION

This application claims priority to and the benefit of, pursuant to 35 U.S.C. §119(e), U.S. provisional patent application Ser. No. 61/498,998, filed Jun. 20, 2011, entitled "A PROGRAMMABLE LOGIC BASED ON A MAGNETIC DIODE AND APPLICATIONS OF SAME," by Bruce W. Wessels and Nikhil Rangaraju, which is incorporated herein in its entirety by reference.

This application is also a continuation-in-part of U.S. patent application Ser. No. 13/401,581, filed Feb. 21, 2012, entitled "A BIPOLAR MAGNETIC JUNCTION TRANSISTOR WITH MAGNETOAMPLIFICATION AND APPLICATIONS OF SAME," by Bruce W. Wessels, Nikhil Rangaraju and John A. Peters, which itself claims priority to and the benefit of, pursuant to 35 U.S.C. §119(e), U.S. provisional patent application Ser. No. 61/444,974, filed Feb. 21, 2011, entitled "A BIPOLAR MAGNETIC JUNCTION TRANSISTOR WITH MAGNETOAMPLIFICATION AND APPLICATIONS OF SAME," by Bruce W. Wessels, Nikhil Rangaraju and John A. Peters, which are incorporated herein in their entireties by reference.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, "[n]" represents the nth reference cited in the reference list. For example, [6] represents the 6th reference cited in the reference list, namely, N. Rangaraju, P. C. Li, and B. W. Wessels, Phys. Rev. B 79, 5 (2009).

STATEMENT OF FEDERALLY-SPONSORED RESEARCH

This invention was made with government support under DMR-0520513 and DMR-0800479 awarded by the National Science Foundation. The government has certain rights in the invention.

FIELD OF THE INVENTION

The present invention relates generally to programmable logic, and more particularly to programmable logic utilizing the magnetoresistance of magnetic diodes and applications of the same.

BACKGROUND OF THE INVENTION

Magnetic devices, which utilize giant magnetoresistive effects, are ubiquitous in nowadays memory systems [1]. Semiconductor devices on the other hand are the building bricks of information processing systems and Si based devices are in almost every processor used now. Integration of memory and processing onto a single chip has been the driving force for the development of magneto-electric materials and devices [2]. Furthermore, programmable logic devices have been proposed to have many advantages including higher speeds compared to application specific logic devices [3]. For example, field programmable logic gives the user versatility by providing the advantage of logic that is tailored to specific uses while in the field. Further developments of a field programmable logic would be to add an additional functionality of making a chip like that reconfigurable while it runs. A logic device that can be controlled by sending instructions to change each gate while the device is in operation could achieve program specific reconfiguration. The added advantage of using a non-volatile system is the possibility of combining logic and memory on a single chip and thus will eliminate the need for magnetic heads [4].

InMnAs, developed by the inventors has a Curie temperature of 330K [5]. Optical measurements have shown that the material has sp-d exchange which leads to the spin splitting of its valence and conduction bands. InMnAs based diodes have shown giant magnetoresistance and a magnetoresistance as high as 2600% was measured at 18 T and 300K [6]. The material has also been used to fabricate the world's first magnetic junction transistor and magneto-amplification effects were demonstrated at room temperature [7]. The advantage of using a magnetic semiconductor based device is the ease of fabrication, integration with present day electronics and the inherent speed advantage. It would gain a great deal of industrial and technological relevance if programmable logic devices utilizing magnetoresistance of InMnAs based diodes could be available.

Therefore, a heretofore unaddressed need exists in the art to address the aforementioned deficiencies and inadequacies.

SUMMARY OF THE INVENTION

In this invention, among other things, programmable logic cells, circuits and apparatus that utilize bipolar semiconductor magnetic junctions as the magnetoresistive element such as magnetic diode are disclosed. Changing a gate using magnetic fields that are generated using input currents creates many unique capabilities. One such capability is the application of an inversion operation using a diode. Diode logic using conventional semiconductor devices is incomplete as none of the inverted gates can be achieved. In this disclosure, a complete logic using one or more of these magnetic diodes is shown.

In one aspect of the invention, a programmable logic cell includes a magnetic diode having a non-magnetic semiconductor layer and a magnetic semiconductor layer disposed on the non-magnetic semiconductor layer. The magnetic diode is configured such that under a forward bias, when a magnetic field applied to the magnetic diode is less than a threshold value, the magnetic diode is in a conductive state in which electric current flows through the magnetic diode, and when the magnetic field applied to the magnetic diode is greater than the threshold value, the magnetic diode is in a resistive state in which the electric current flowing through the magnetic diode is substantially reduced. In one embodiment, the non-magnetic semiconductor layer comprises an n-type doped III-V compound containing an element of Group III and an element of Group V. The non-magnetic semiconductor layer in one embodiment includes n-type doped InAs. In one embodiment, the magnetic semiconductor layer comprises a p-type doped III-Mn-V compound containing an element of Group III, Manganese (Mn) and an element of Group V. In one embodiment, the magnetic semiconductor layer comprises p-type doped InMnAs.

The programmable logic cell further includes a first input wire for receiving a first input current, and a second input wire for receiving a second input current. The first and second input wires are oriented along a first direction parallel to the magnetic semiconductor layer of the magnetic diode and positioned spaced-apart along a second direction perpendicular to the first direction over the magnetic semiconductor layer of the magnetic diode, such that when either of the first input current and the second input current flows through a respective input wire of the first input wire and the second input wire and no current flows through the other input wire, a magnetic field generated in the magnetic diode is less than the threshold value, and when both the first input current and the second input current flow through the first input wire and the second input wire, respectively, along the same direction, the magnetic field generated in the magnetic diode is greater than the threshold value.

Additionally, the programmable logic cell includes an output wire oriented along a third direction perpendicular to the first and second directions and positioned under the non-magnetic semiconductor layer of the magnetic diode for outputting a logic "0" or "1" responsive to the first input current, and the second input current.

The programmable logic cell is corresponding to a logic NAND gate, where the output wire outputs the logic "1", when both the first and second input wires have no input current, or when either of the first and second input wires have an input current and the other has no input current, and the output wire outputs the logic "0", when both the first and second input wires have input current.

Furthermore, the programmable logic cell also includes an operation control wire parallel positioned over the first input wire for receiving an operation control current, so as to implement a logic OR gate, a logic AND gate, or a logic NOR gate.

In one embodiment, the operation control current is configured to flow through the operation control wire in a direction opposite to the current flow in the first and second input wire in such a way that magnetic field due to the operation control current nullifies the magnetic field generated when there is the current flowing in the first and second input wires, thereby implementing the logic OR gate.

In another embodiment, the operation control current is increased by the first input current, thereby implementing the logic AND gate.

In yet another embodiment, the operation control current is configured to flow through the operation control wire in the same direction as the current flow in the first and second input wire in such a way that magnetic field due to the operation control current adds to the magnetic field generated when there is the current flowing in either of the first and second input wires resulting it greater than the threshold value, thereby implementing the logic NOR gate.

In another aspect of the invention, a programmable logic cell has a first magnetic diode having a cathode connected to a first input port for receiving a first input signal and an anode, a second magnetic diode having a cathode connected to a second input port for receiving a second input signal and an anode connected to the anode of the first magnetic diode, a transistor having a base connected to the anode of the second magnetic diode and a collector connected to an output port for outputting a logic "0" or "1" responsive to the first and second input signals, and an emitter connected to ground, a first resistor having a first terminal connected to a voltage source having a positive voltage and a second terminal connected to the anode of the first magnetic diode, and a second resistor having a first terminal connected to the voltage source and a second terminal connected to the collector of the transistor.

Each magnetic diode is configured such that under a forward bias, when a magnetic field applied to the magnetic diode is less than a threshold value, the magnetic diode is in a conductive state in which electric current flows through the magnetic diode, and when the magnetic field applied to the magnetic diode is greater than the threshold value, the magnetic diode is in a resistive state in which the electric current flowing through the magnetic diode is substantially reduced.

Each of the first input signal and the second input signal is a low voltage for which a corresponding one of the first and second magnetic diodes is forward-biased or a high voltage for which the corresponding one of the first and second magnetic diodes is reverse-biased.

In one embodiment, the programmable logic cell is corresponding to a logic NAND gate, where the output port outputs the logic "1", when both the first and second input ports receive the low voltage, or when either of the first and second input ports receives the high voltage and the other receives the low voltage, and the output port outputs the logic "0", when both the first and second input ports receive the high voltage.

In another embodiment, the programmable logic cell is corresponding to a logic AND gate when a magnetic field is applied to the first and second magnetic diodes.

In yet another aspect of the invention, a programmable logic cell includes a first diode having a cathode connected to a first input port for receiving a first input signal and an anode, a second diode having a cathode connected to a second input port for receiving a second input signal and an anode connected to the anode of the first diode, a transistor having a base electrically coupled to the anode of the second diode and a collector connected to an output port for outputting a logic "0" or "1" responsive to the first and second input signals, and an emitter connected to ground. In one embodiment, each of the first input signal and the second input signal is a low voltage for which a corresponding one of the first and second diodes is forward-biased or a high voltage for which the corresponding one of the first and second diodes is reverse-biased. In one embodiment, the programmable logic cell further includes a third diode having a cathode connected to the base of the transistor and an anode connected to the anode of the second diode. In one embodiment, at least one of the first, second and third diodes is a magnetic diode.

The programmable logic cell further has a magnetic diode having a cathode and an anode connected to a voltage source having a positive voltage. The magnetic diode is configured such that under a forward bias, when a magnetic field applied to the magnetic diode is less than a threshold value, the magnetic diode is in a conductive state in which electric current flows through the magnetic diode, and when the magnetic field applied to the magnetic diode is greater than the threshold value, the magnetic diode is in a resistive state in which the electric current flowing through the magnetic diode is substantially reduced.

The programmable logic cell also includes a first resistor having a first terminal and a second terminal connected to the anode of the first diode, and a second resistor having a first terminal and a second terminal connected to the collector of the transistor, where the first terminal of one of the first and second resistors is connected to the cathode of the magnetic diode and the first terminal of the other of the first and second resistors is connected to the voltage source.

In one embodiment, the programmable logic cell is a logic NAND gate, where the output port outputs the logic "1", when both the first and second input ports receive the low voltage, or when either of the first and second input ports receives the high voltage and the other receives the low voltage, and the output port outputs the logic "0", when both the first and second input ports receive the high voltage.

In one embodiment, the programmable logic cell is corresponding to a logic AND gate when a magnetic field is applied to the magnetic diode.

In a further aspect of the invention, a programmable logic cell includes a multi-emitter transistor having a base, three emitters connected respectively to a first input port for receiving a first input signal, a second input port for receiving a second input signal and an operation control port for receiving a control signal, and a collector. The multi-emitter transistor comprises a bipolar magnetic junction transistor having a magnetic diode configured such that such that under a forward bias, when a magnetic field applied to the magnetic diode responsive to the control signal is less than a threshold value, the magnetic diode is in a conductive state in which electric current flows through the magnetic diode, and when the magnetic field applied to the magnetic diode is greater than the threshold value, the magnetic diode is in a resistive state in which the electric current flowing through the magnetic diode is substantially reduced.

In one embodiment, the magnetic diode is formed of a magnetic semiconductor layer and a non-magnetic semiconductor layer, where the non-magnetic semiconductor layer comprises an n-type doped III-V compound containing an element of Group III and an element of Group V. In one embodiment, the non-magnetic semiconductor layer comprises n-type doped InAs. The magnetic semiconductor layer comprises a p-type doped III-Mn-V compound containing an element of Group III, Manganese (Mn) and an element of Group V. In one embodiment, the magnetic semiconductor layer comprises p-type doped InMnAs.

the programmable logic cell also includes a first resistor having a first terminal connected to a voltage source having a positive voltage and a second terminal connected to the base of the multi-emitter transistor, a second resistor having a first terminal connected to the voltage source and a second terminal, and a first transistor having a base connected to the collector of the multi-emitter transistor, a collector connected to the second terminal of the second resistor and electrically coupled to an output port for outputting logic "0" or "1" responsive to the first and second input signals and the control signal, and an emitter electrically coupled to ground.

Further, the programmable logic cell may have a third resistor having a first terminal connected to the voltage source and a second terminal, a fourth resistor having a first terminal connected to the emitter of the first transistor and a second terminal connected to the ground, a second transistor having a base connected to the collector of the first transistor, a collector connected to the second terminal of the third resistor, and an emitter, a third transistor having a base connected to the emitter of the first transistor, a collector connected to the output port, and an emitter connected to the ground, and a diode having an anode connected to the emitter of the second transistor and a cathode connected to the collector of the third transistor.

In one embodiment, the programmable logic cell is a logic NAND gate.

In another embodiment, the programmable logic cell is a logic AND gate when a magnetic field is applied to the magnetic diode.

In yet a further aspect of the invention, a programmable logic apparatus includes at least one reprogrammable logic cell as disclosed above.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

FIG. 3 shows schematically a circuit of a programmable logic cell according to another embodiment of the present invention.

FIG. 4 shows schematically a circuit of a programmable logic cell according to yet another embodiment of the present invention.

DETAILED DESCRIPTION OF THE INVENTION

Figure 1:
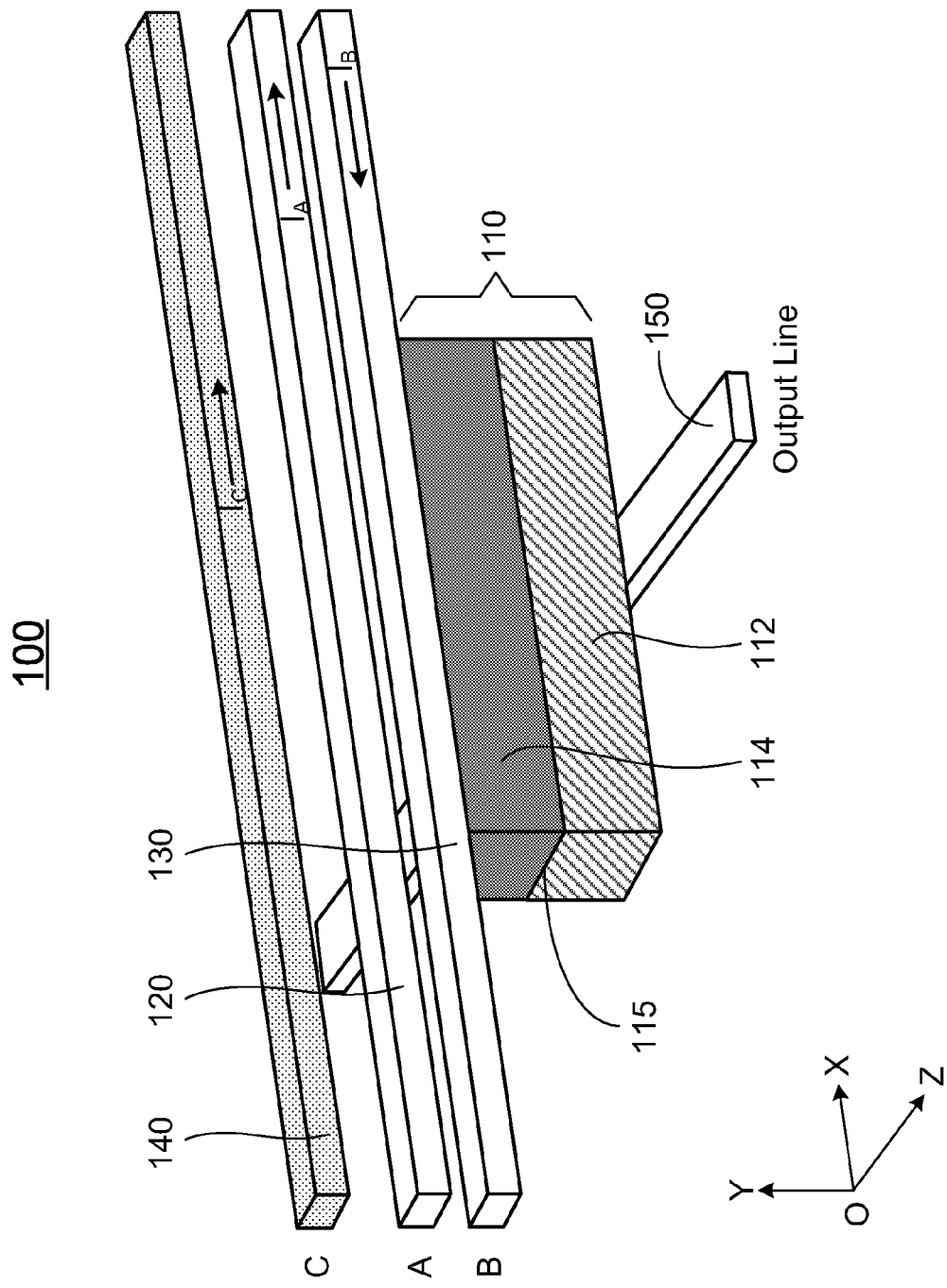
FIG. 1 shows schematically a prospective view of a programmable logic cell according to one embodiment of the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that, as used in the description herein and throughout the claims that follow, the meaning of "a", "an", and "the" includes plural reference unless the context clearly dictates otherwise. Also, it will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising," "including," "carrying," "having," "containing," "involving," and the like are to be understood to be open-ended, i.e., to mean including but not limited to.

The description will be made as to the embodiments of the present invention in conjunction with the accompanying drawings in FIGS. 1-6. In accordance with the purposes of this invention, as embodied and broadly described herein, this invention, in one aspect, relates to magnetic diode based programmable logic that utilizes the magnetoresistance of magnetic diodes to operate the programmable logic from one logic gate to another logic gate.

A logic NAND gate is a universal logic gate in that all the other Boolean operations can be implemented exclusively with logic NAND gates. This property is called functional completeness. According to the invention, an implementation of a logic NAND gate can be reprogrammed.

Referring to FIG. 1, a programmable logic cell is shown schematically according to one embodiment of the present invention. In the exemplary embodiment, the programmable logic cell 100 includes a magnetic diode 110 having a non-magnetic semiconductor layer 112 and a magnetic semiconductor layer 114 disposed on the non-magnetic semiconductor layer 112, and a heterojunction 115 formed at an interface region between the non-magnetic semiconductor layer 112 and the non-magnetic semiconductor layer 114. The magnetic semiconductor layer 114 is formed of a magnetic semiconductor. According to the invention, the magnetic semiconductor comprises a ferromagnetic material and/or a paramagnetic material. Therefore, a magnetic diode recited in the disclosure may refer to a ferromagnetic diode or a paramagnetic diode.

When such a magnetic diode 110 is operated in the turn-on region in a forward bias, the diode current is strongly dependent on the presence of magnetic fields. Magnetic fields applied either parallel (longitudinal) or perpendicular (transverse) to the flow of current through the heterojunction 115 of the magnetic diode 110 lead to a positive magnetoresistance. The heterojunction magnetoresistance is substantially proportional to the applied magnetic field. As such, for the magnetic diode 110 operated under the forward bias, when a magnetic field applied to the magnetic diode 110 is less than a threshold value, $B_{th}$, the magnetic diode 110 is in a conductive state in which electric current flows through the magnetic diode 110, and when the magnetic field applied to the magnetic diode 110 is greater than the threshold value $B_{th}$, the magnetic diode 110 is in a resistive state in which the electric current flowing through the magnetic diode 110 is substantially reduced.

In one embodiment, the non-magnetic semiconductor layer 112 is formed of an n-type doped III-V compound containing an element of Group III and an element of Group V, for example, n-type doped InAs. The magnetic semiconductor layer 114 is formed of a p-type doped III-Mn-V compound containing an element of Group III, Manganese (Mn) and an element of Group V, for example, p-type doped InMnAs. It is shown by the inventors that InMnAs has a Curie temperature of 330K [5]. Optical measurements have shown that the material has sp-d exchange that leads to the spin splitting of its valence and conduction bands. InMnAs based diodes have shown giant magnetoresistance and a magnetoresistance as high as 2600% was measured at 18 T and 300K [6]. This material has also been used to fabricate the world's first magnetic junction transistor and magneto-amplification effects were demonstrated at room temperature [7]. The advantage of using a magnetic semiconductor based device is the ease of fabrication, integration with present day electronics and the inherent speed advantage. According to the invention, just one single magnetic layer is utilized in the programmable logic cell 100.

As shown in FIG. 1, the programmable logic cell 100 further includes a first electrically conductive input wire/line (A) 120 for receiving a first input current, $I_A$, a second electrically conductive input wire/line (B) 130 for receiving a second input current, $I_B$, and an electrically conductive operation control wire/line (C) 140 for receiving an operation control current, $I_C$. The first input wire 120, the second input wire 130 and the operation control wire 140 are oriented along a first direction (e.g., the OX axis) parallel to the magnetic semiconductor layer 114 of the magnetic diode 110 and positioned spaced-apart along a second direction (e.g., the OY axis) perpendicular to the first direction over the magnetic semiconductor layer 114 of the magnetic diode 110. As such, when either of the first input current $I_A$ and the second input current $I_B$ flows through a respective input wire of the first input wire 120 and the second input wire 130 and no current flows through the other input wire, a magnetic field generated in the magnetic diode 110 is less than the threshold value $B_{th}$, and when both the first input current $I_A$ and the second input current $I_B$ flow through the first input wire 120 and the second input wire 130, respectively, along the same direction, the magnetic field generated in the magnetic diode 110 is greater than the threshold value $B_{th}$.

The input current $I_A$ ($I_B$) flowed in the first input wire/line 120 (the second input wire/line 130) is identified with the logic "0" when no current flows through the first input lines 120 (the second input line 130), and with the logic "1" when the input current $I_A$ ($I_B$) flows in the first input wire/line 120 (the second input wire/line 130) in either direction. The operation control wire/line 140 is used to control the magnetic field generated in the magnetic diode 110 and define the operations of the programmable logic cell 100.

Additionally, the programmable logic cell 100 includes an output wire 150 oriented along a third direction (e.g., the OZ axis) perpendicular to the first and second directions and positioned under the non-magnetic semiconductor layer 112 of the magnetic diode 110 for outputting a logic "0" or "1" responsive to the first input current $I_A$, the second input current $I_B$, and the operation control current $I_C$.

The active region in the programmable logic cell 100 is the magnetic diode 110 where the p-layer 114 is made of a dilute magnetic semiconductor. The magnetoresistance of the magnetic diode 110 allows defining the logic "0" and "1" for the resistive and conductive states. When the magnetic field generated in the magnetic diode 110 is lower than the threshold value $B_{th}$ the resistance of the magnetic diode 110 is low and it is assigned a value of the logic "1" and when the magnetic field generated in the magnetic diode 110 by the input currents $I_A$ and $I_B$ is higher than threshold value $B_{th}$ the value assigned is the logic "0".

Accordingly, without the operation control current $I_C$ applied to the operation control line 140, the programmable logic cell 100 is corresponding to a logic NAND gate, where the output wire 150 outputs the logic "1", when both the first and second input wires 120 and 130 have no input current, or when either of the first and second input wires 120 and 130 have an input current $I_A$ or $I_B$, and the other has no input current, and the output wire 150 outputs the logic "0", when both the first and second input wires 120 and 130 have the input currents $I_A$ and $I_B$, respectively. Table 1 lists the truth table of the logic NAND gate.

TABLE 1

A truth table of the logic NAND gate.

| Input A | Input B | Output |
|---|---|---|
| 0 | 0 | 1 |
| 0 | 1 | 1 |
| 1 | 0 | 1 |
| 1 | 1 | 0 |

As discussed above, the operation control line 140 has not been used to realize the logic NAND gate. In one embodiment, the operation control current $I_C$ applied to the operation control line 140 can be used to change the magnetic field experienced by the magnetic diode 110 and help reprogram the logic NAND gate to a different gate, such as a logic OR gate, a logic AND gate, or a logic NOR gate, while in operation. This unique capability of the programmable logic cell 100 will lead to field reprogrammable devices where simple instructions can be used to construct a whole new set of logic gates.

For example, if the operation control current $I_C$ is configured to flow through the operation control wire 140 in a direction opposite to the current flow in the first and second input wires 120 and 130 in such a way that magnetic field due to the operation control current $I_C$ nullifies the magnetic field generated when there is the current flowing in the first and second input wires 120 and 130, the logic OR gate is implemented. The truth table of the logic OR logic gate is listed in Table 2.

TABLE 2

A truth table of the logic OR logic gate.

| Input A | Input B | Output |
|---|---|---|
| 0 | 0 | 0 |
| 0 | 1 | 1 |
| 1 | 0 | 1 |
| 1 | 1 | 1 |

Furthermore, if the operation control current $I_C$ is increased approximately by the first input current $I_A$, the logic AND gate is implemented. Table 3 lists the truth table of the logic AND gate.

TABLE 3

A truth table of the AND logic gate.

| Input A | Input B | Output |
|---|---|---|
| 0 | 0 | 0 |
| 0 | 1 | 0 |
| 1 | 0 | 0 |
| 1 | 1 | 1 |

A logic NOR gate is another functionally gate in that all the other Boolean operations can be implemented exclusively with a combination of the NOR gates. According to one embodiment of the invention, by changing the operation control current $I_C$, the logic NAND gate can be switched to the logic NOR gate. In this embodiment, the operation control current $I_C$ is configured to flow through the operation control wire 140 in the same direction as the current flow in the first and second input wire 120 and 130 in such a way that magnetic field due to the operation control current $I_C$ adds to the magnetic field generated when there is the current flowing in either of the first and second input wires 120 and 130 resulting it greater than the threshold value $B_{th}$, so that the logic NOR gate is obtained. The truth table of the logic NOR gate is listed in Table 4.

TABLE 4

A truth table of the logic NOR gate.

| Input A | Input B | Output |
|---------|---------|--------|
| 0 | 0 | 1 |
| 0 | 1 | 0 |
| 1 | 0 | 0 |
| 1 | 1 | 0 |

Figure 2:
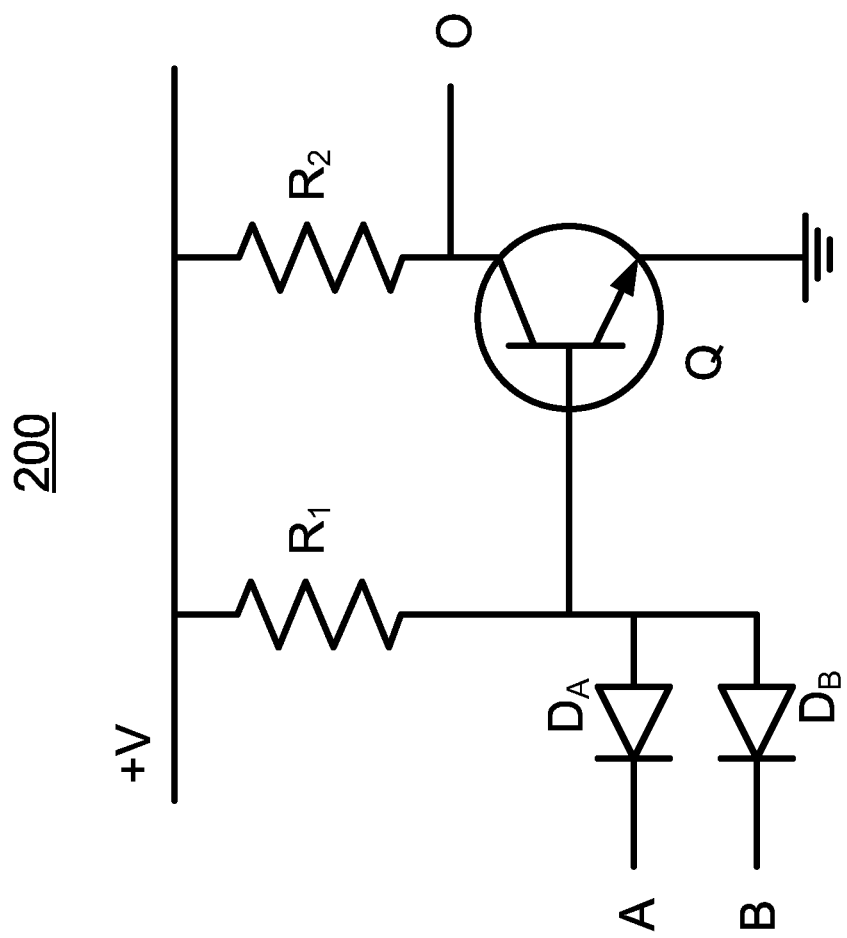
FIG. 2 shows schematically a circuit of a programmable logic cell according to one embodiment of the present invention.

FIG. 2 shows schematically a circuit of a diode-transistor logic (DTL) NAND gate (programmable logic cell) 200 utilizing magnetic diodes and transistor ( ) according to one embodiment of the present invention. In the exemplary embodiment, the programmable logic cell 200 has a first magnetic diode $D_A$ having a cathode connected to a first input port A for receiving a first input signal and an anode, a second magnetic diode $D_B$ having a cathode connected to a second input port B for receiving a second input signal and an anode connected to the anode of the first magnetic diode $D_A$, a transistor Q having a base connected to the anode of the second magnetic diode $D_A$ and a collector connected to an output port O for outputting a logic "0" or "1" responsive to the first and second input signals, and an emitter connected to ground, a first resistor $R_1$ having a first terminal connected to a voltage source having a positive voltage +V and a second terminal connected to the anode of the first magnetic diode, and a second resistor $R_2$ having a first terminal connected to the voltage source and a second terminal connected to the collector of the transistor Q.

Each of the first input signal and the second input signal is a low voltage, assigned with the logic "0", for which a corresponding one of the first and second magnetic diodes $D_A$ and $D_B$ is forward-biased or a high voltage, assigned with the logic "1", for which the corresponding one of the first and second magnetic diodes $D_A$ and $D_B$ is reverse-biased.

Each magnetic diode $D_A/D_B$ is configured such that under a forward bias, when a magnetic field applied to the magnetic diode $D_A/D_B$ is less than a threshold value, $B_{th}$, the magnetic diode $D_A/D_B$ is in a conductive state in which electric current flows through the magnetic diode $D_A/D_B$, and when the magnetic field applied to the magnetic diode $D_A/D_B$ is greater than the threshold value $B_{th}$, the magnetic diode $D_A/D_B$ is in a resistive state in which the electric current flowing through the magnetic diode $D_A/D_B$ is substantially reduced.

Without applying a magnetic filed, the magnetic diodes $D_A$ and $D_B$ act conventional semiconductor diodes, the programmable logic cell 200 then operates as a logic NAND gate, where the output port O outputs the logic "1", when both the first and second input ports A and B receive the low voltage, or when either of the first and second input ports A and B receives the high voltage and the other receives the low voltage, and the output port O outputs the logic "0", when both the first and second input ports A and B receive the high voltage.

However, when a magnetic field is applied to the first and second magnetic diodes $D_A$ and $D_B$, the programmable logic cell 200 operates as a logic AND gate.

Similarly, a logic NOR gate can be changed to a logic OR gate.

Referring to FIGS. 3 and 4, circuits of programmable logic cells 300 and 400 are respectively shown according to two embodiments of the present invention. The circuits of the programmable logic cells 300 and 400 are similar to that of the programmable logic cell 200 shown in FIG. 2, except that a magnetic diode M is added in series with the resistor $R_1$ on the lift branch of the circuit, as shown in FIG. 3, or added in series with the resistor $R_2$ on the right branch of the circuit, as shown in FIG. 4, so as to modify the logic NAND gate. The magnetic diode M is configured such that under a forward bias, when a magnetic field applied to the magnetic diode is less than a threshold value, $B_{th}$, the magnetic diode M is in a conductive state in which electric current flows through the magnetic diode, and when the magnetic field applied to the magnetic diode M is greater than the threshold value $B_{th}$, the magnetic diode M is in a resistive state in which the electric current flowing through the magnetic diode M is substantially reduced. In addition, the programmable logic cell 300/400 also includes a third diode electrically coupled between the first and second diodes and the transistor Q, for increasing the voltage required to turn on the transistor Q. This gives a better separation between the voltage levels recognized as the logic "0" and the logic "1".

Specifically, the programmable logic cell 300/400 includes a first diode $D_A$, a second diode $D_B$, a third diode $D_C$, a magnetic diode M, a first resistor $R_1$, a second resistor $R_2$, and a transistor Q, as shown in FIGS. 3 and 4. The first diode $D_A$ and the second diode $D_B$ have their cathodes respectively connected to a first input port A for receiving a first input signal and a second input port B for receiving a second input signal and their anodes connected together which in turn is connected to the anode of the third diode $D_C$. The cathode of the third diode $D_C$ is connected to the base of the transistor Q. The emitter and the collector of the transistor Q are respectively connected to ground and an output port Q adapted for outputting the logic "0" or "1" responsive to the first and second input signals.

In the programmable cell 300, the first resistor $R_1$ has its first terminal connected to the cathode of the magnetic diode M and its second terminal connected to the anode of the first diode $D_A$. The second resistor $R_2$ has its first terminal connected the voltage source having a positive voltage +V and its second terminal connected to the collector of the transistor Q. The anode of the magnetic diode M is connected to the voltage source, as shown in FIG. 3.

However, in the programmable cell 400, the first resistor $R_1$ has its first terminal connected the voltage source having a positive voltage +V and its second terminal connected to the anode of the first diode $D_A$. The second resistor $R_2$ has its first terminal connected to the cathode of the magnetic diode M and its second terminal connected to the collector of the transistor Q. The anode of the magnetic diode M is connected to the voltage source, as shown in FIG. 4.

The logic NAND gate implemented with the diodes $D_A$ and $D_B$ uses the two inputs A and B and multiplies them and the transistor inverts the product. This inversion operation can be controlled by the diode we have added to the circuit. By changing the resistance in either the left or the right branch of the circuit, the output of the transistor Q can be modified. Using a magnetic diode M can change the output of the transistor Q by either changing the base current on the transistor Q or by changing the voltage applied across the emitter-collector junction of the transistor Q. This change in the output of the transistor Q changes the logic NAND gate to the logic AND gate and allows for logic circuits that can be morphed by sending simple instructions. Instead of the logic NAND gate shown here, other logic gates can also be modified using a magnetic diode.

Furthermore, each of the first, second and third diodes $D_A$, $D_B$ and $D_C$ shown in FIGS. 3 and 4, can be replaced with a magnetic diode for controlling both the input and output states. Changing the input states during operation gives rise to tremendous control over the operation of the logic gate.

Figure 5:
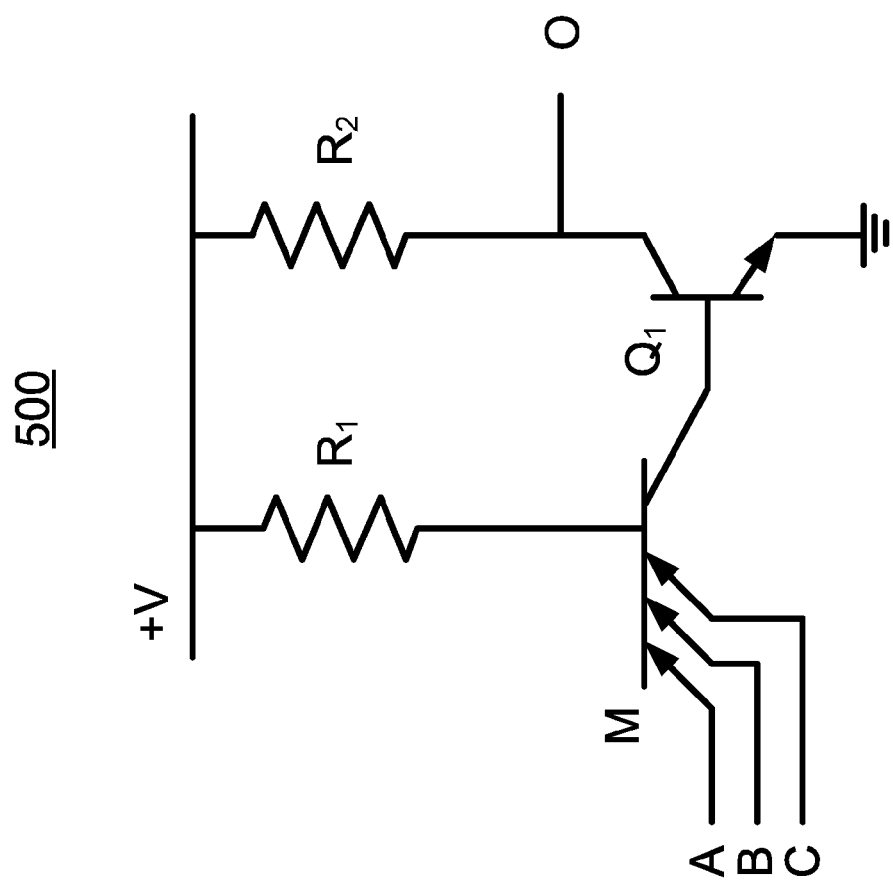
FIG. 5 shows schematically a circuit of a programmable logic cell according to a further embodiment of the present invention.

Referring to FIG. 5, a circuit of a transistor-transistor logic (TTL) NAND gate (programmable logic cell) 500 utilizing a multi-emitter bipolar magnetic junction transistor (MJT) is shown schematically according to one embodiment of the present invention. In this example, the programmable logic cell 500 includes a multi-emitter transistor M, a first transistor $Q_1$, a first resistor $R_1$ and a second resistor $R_2$.

The multi-emitter transistor M has a base connected the first resistor $R_1$ that in turn is connected to a voltage source, three emitters connected respectively to a first input port A for receiving a first input signal, a second input port B for receiving a second input signal and an operation control port C for receiving a control signal, and a collector connected to the anode of the first transistor $Q_1$. The emitter and the collector of the first transistor $Q_1$ are respectively connected to ground and an output port O. The second resistor $R_2$ is connected between the collector of the first transistor $Q_1$ and the voltage source.

The multi-emitter transistor M comprises a bipolar magnetic junction transistor having a magnetic diode configured such that such that under a forward bias, when a magnetic field applied to the magnetic diode responsive to the control signal is less than a threshold value, the magnetic diode is in a conductive state in which electric current flows through the magnetic diode, and when the magnetic field applied to the magnetic diode is greater than the threshold value, the magnetic diode is in a resistive state in which the electric current flowing through the magnetic diode is substantially reduced. In one embodiment, the magnetic diode is formed a magnetic semiconductor layer and a non-magnetic semiconductor layer, where the non-magnetic semiconductor layer comprises an n-type doped III-V compound containing an element of Group III and an element of Group V. In one embodiment, the non-magnetic semiconductor layer comprises n-type doped InAs. The magnetic semiconductor layer comprises a p-type doped III-Mn-V compound containing an element of Group III, Manganese (Mn) and an element of Group V. In one embodiment, the magnetic semiconductor layer comprises p-type doped InMnAs.

For example, an InMnAs bipolar junction transistor has two back-to-back diodes. One of the diodes (the InMnAs-InAs junction) can act as the emitter or collector. The resistance of the InMnAs junction changes when a magnetic field is applied to the InMnAs junction.

In the absence of a magnetic filed, the programmable logic cell 500 operates as a logic NAND gate. When one of the inputs A or B is low, the current available through $R_1$ at the base of the multi-emitter transistor M is diverted to ground. No current flows from the base to the collector of the multi-emitter transistor M, and therefore no current reaches the base of the first (output) transistor $Q_1$. Thus, the output transistor $Q_1$ is off. The pull-up resistor $R_2$ charges the output port O to the high-voltage state. Only when both inputs A and B are high can the current flow through $R_1$ from base to collector of the multi-emitter transistor M to turn on the output transistor $Q_1$. In this case, the output path discharges to ground.

By controlling each of the inputs using a magnetic field, the output of the programmable logic cell 500 shown in FIG. 5 can be changed from the logic NAND gate to a logic AND gate. Similar changes from a logic NOR gate to a logic OR gate, or the other logic operations can also be achieved using a similar multi-emitter TTL circuit.

Figure 6:
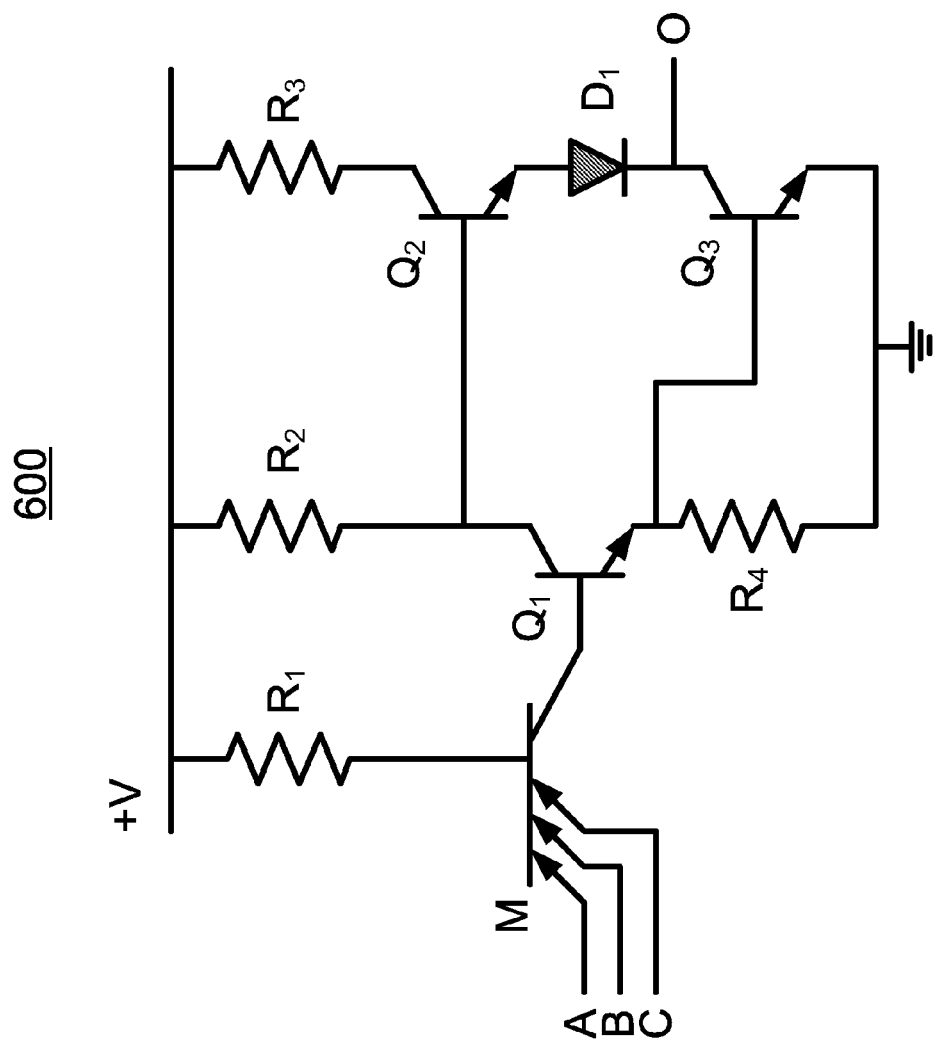
FIG. 6 shows schematically a circuit of a programmable logic cell according to yet a further embodiment of the present invention.

FIG. 6 shows another embodiment of the circuit of the transistor-transistor logic (TTL) NAND gate (programmable logic cell) 600. In addition to the multi-emitter transistor M, a first transistor $Q_1$, a first resistor $R_1$ and a second resistor $R_2$, as shown in FIG. 5, the programmable logic cell 600 also includes a third resistor $R_3$ having a first terminal connected to the voltage source and a second terminal, a fourth resistor $R_4$ having a first terminal connected to the emitter of the first transistor $Q_1$ and a second terminal connected to the ground, a second transistor $Q_2$ having a base connected to the collector of the first transistor $Q_1$, a collector connected to the second terminal of the third resistor $R_3$, and an emitter, a third transistor $Q_3$ having a base connected to the emitter of the first transistor $R_1$, a collector connected to the output port, and an emitter connected to the ground, and a diode $D_1$ having an anode connected to the emitter of the second transistor $Q_2$ and a cathode connected to the collector of the third transistor $Q_3$.

The programmable logic cell 600 is corresponding to the logic NAND gate in the absence of a magnetic filed.

By controlling each of the inputs using a magnetic field, the output of the programmable logic cell 600 shown in FIG. 6 can be changed from the logic NAND gate to a logic AND gate. Similar changes from a logic NOR gate to a logic OR gate, or the other logic operations can also be achieved using a similar multi-emitter TTL circuit.

In certain aspects of the invention, a programmable logic array or apparatus includes at least one reprogrammable logic cell as disclosed above.

In summary, the present invention, among other things, recites magnetic diode based programmable logic that utilizes the magnetoresistance of magnetic diodes to operate the programmable logic from one logic gate to another logic gate. Changing a gate using magnetic fields that are generated using input currents creates many unique capabilities. The unique capabilities will lead to field reprogrammable devices where simple instructions can be used to construct a whole new set of gates.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

LIST OF REFERENCES

[1] W. P. McCray, Nat. Nanotechnol. 4, 2 (2009).
[2] D. D. Awschalom, and M. E. Flatte, Nat. Phys. 3, 153 (2007).
[3] H. Dery et al., Nature 447, 573 (2007).
[4] A. Ney et al., Nature 425, 485 (2003).
[5] B. W. Wessels, New J. Phys. 10 (2008).
[6] N. Rangaraju, P. C. Li, and B. W. Wessels, Phys. Rev. B 79, 5 (2009).
[7] N. Rangaraju, J. A. Peters, and B. W. Wessels, Phys. Rev. Lett. 105, 4 (2010).

What is claimed is:

1. A programmable logic cell, comprising:
   a magnetic diode having a non-magnetic semiconductor layer and a magnetic semiconductor layer disposed on the non-magnetic semiconductor layer, wherein the magnetic diode is configured such that under a forward bias, when a magnetic field applied to the magnetic diode is less than a threshold value, the magnetic diode is in a conductive state in which electric current flows through the magnetic diode, and when the magnetic field applied to the magnetic diode is greater than the threshold value, the magnetic diode is in a resistive state in which the electric current flowing through the magnetic diode is substantially reduced;
   a first input wire for receiving a first input current, and a second input wire for receiving a second input current, wherein the first and second input wires are oriented along a first direction parallel to the magnetic semiconductor layer of the magnetic diode and positioned spaced-apart along a second direction perpendicular to the first direction over the magnetic semiconductor layer of the magnetic diode, such that when either of the first input current and the second input current flows through a respective input wire of the first input wire and the second input wire and no current flows through the other input wire, a magnetic field B generated in the magnetic diode is less than the threshold value, and when both the first input current and the second input current flow through the first input wire and the second input wire, respectively, along the same direction, the magnetic field generated in the magnetic diode is greater than the threshold value; and
   an output wire oriented along a third direction perpendicular to the first and second directions and positioned under the non-magnetic semiconductor layer of the magnetic diode for outputting a logic "0" or "1" responsive to the first input current and the second input current.

2. The programmable logic cell of claim 1, being a logic NAND gate.

3. The programmable logic cell of claim 1, further comprising an operation control wire paralelly positioned over the first input wire for receiving an operation control current, so as to implement a logic OR gate, a logic AND gate, or a logic NOR gate.

4. The programmable logic cell of claim 3, wherein the operation control current is configured to flow through the operation control wire in a direction opposite to the current flow in the first and second input wire in such a way that magnetic field due to the operation control current nullifies the magnetic field generated when there is the current flowing in the first and second input wires, thereby implementing the logic OR gate.

5. The programmable logic cell of claim 4, wherein the operation control current is increased by the first input current, thereby implementing the logic AND gate.

6. The programmable logic cell of claim 3, wherein the operation control current is configured to flow through the operation control wire in the same direction as the current flow in the first and second input wire in such a way that magnetic field due to the operation control current adds to the magnetic field generated when there is the current flowing in either of the first and second input wires resulting it greater than the threshold value, thereby implementing the logic NOR gate.

7. The programmable logic cell of claim 1, wherein the non-magnetic semiconductor layer comprises an n-type doped III-V compound containing an element of Group III and an element of Group V.

8. The programmable logic cell of claim 7, wherein the non-magnetic semiconductor layer comprises n-type doped InAs.

9. The programmable logic cell of claim 1, wherein the magnetic semiconductor layer comprises a p-type doped III-Mn-V compound containing an element of Group III, Manganese (Mn) and an element of Group V.

10. The programmable logic cell of claim 9, wherein the magnetic semiconductor layer comprises p-type doped InMnAs.

11. A programmable logic apparatus, comprising at least one reprogrammable logic cell of claim 1.

12. A programmable logic cell, comprising:
    a first magnetic diode having a cathode connected to a first input port for receiving a first input signal and an anode;
    a second magnetic diode having a cathode connected to a second input port for receiving a second input signal and an anode connected to the anode of the first magnetic diode;
    a transistor having a base connected to the anode of the second magnetic diode and a collector connected to an output port for outputting a logic "0" or "1" responsive to the first and second input signals, and an emitter connected to ground;
    a first resistor having a first terminal connected to a voltage source having a positive voltage and a second terminal connected to the anode of the first magnetic diode; and
    a second resistor having a first terminal connected to the voltage source and a second terminal connected to the collector of the transistor,
    wherein each magnetic diode is configured such that under a forward bias, when a magnetic field applied to the magnetic diode is less than a threshold value, the magnetic diode is in a conductive state in which electric current flows through the magnetic diode, and when the magnetic field applied to the magnetic diode is greater than the threshold value, the magnetic diode is in a resistive state in which the electric current flowing through the magnetic diode is substantially reduced; and
    wherein each of the first input signal and the second input signal is a low voltage for which a corresponding one of the first and second magnetic diodes is forward-biased or a high voltage for which the corresponding one of the first and second magnetic diodes is reverse-biased.

13. The programmable logic cell of claim 12, being a logic NAND gate.

14. The programmable logic cell of claim 12, being a logic AND gate when a magnetic field is applied to the first and second magnetic diodes.

15. A programmable logic apparatus, comprising at least one reprogrammable logic cell of claim 12.

16. A programmable logic cell, comprising:
    a first diode having a cathode connected to a first input port for receiving a first input signal and an anode;
    a second diode having a cathode connected to a second input port for receiving a second input signal and an anode connected to the anode of the first diode;
    a transistor having a base electrically coupled to the anode of the second diode and a collector connected to an output port for outputting a logic "0" or "1" responsive to the first and second input signals, and an emitter connected to ground;

a magnetic diode having a cathode and an anode connected to a voltage source having a positive voltage, wherein the magnetic diode is configured such that under a forward bias, when a magnetic field applied to the magnetic diode is less than a threshold value, the magnetic diode is in a conductive state in which electric current flows through the magnetic diode, and when the magnetic field applied to the magnetic diode is greater than the threshold value, the magnetic diode is in a resistive state in which the electric current flowing through the magnetic diode is substantially reduced;

a first resistor having a first terminal and a second terminal connected to the anode of the first diode; and a second resistor having a first terminal and a second terminal connected to the collector of the transistor, wherein the first terminal of one of the first and second resistors is connected to the cathode of the magnetic diode and the first terminal of the other of the first and second resistors is connected to the voltage source; and wherein each of the first input signal and the second input signal is a low voltage for which a corresponding one of the first and second diodes is forward-biased or a high voltage for which the corresponding one of the first and second diodes is reverse-biased.

17. The programmable logic cell of claim 16, being a logic NAND gate, wherein the output port outputs the logic "1", when both the first and second input ports receive the low voltage, or when either of the first and second input ports receives the high voltage and the other receives the low voltage, and wherein the output port outputs the logic "0", when both the first and second input ports receive the high voltage.

18. The programmable logic cell of claim 16, being a logic AND gate when a magnetic field is applied to the magnetic diode.

19. The programmable logic cell of claim 16, further comprising a third diode having a cathode connected to the base of the transistor and an anode connected to the anode of the second diode.

20. The programmable logic cell of claim 16, wherein at least one of the first, second and third diodes is a magnetic diode.

21. A programmable logic apparatus, comprising at least one reprogrammable logic cell of claim 16.

22. A programmable logic cell, comprising:

a multi-emitter transistor having a base, three emitters connected respectively to a first input port for receiving a first input signal, a second input port for receiving a second input signal and an operation control port for receiving a control signal, and a collector, wherein the multi-emitter transistor comprises a bipolar magnetic junction transistor having a magnetic diode configured such that under a forward bias, when a magnetic field applied to the magnetic diode responsive to the control signal is less than a threshold value, the magnetic diode is in a conductive state in which electric current flows through the magnetic diode, and when the magnetic field applied to the magnetic diode is greater than the threshold value, the magnetic diode is in a resistive state in which the electric current flowing through the magnetic diode is substantially reduced;

a first resistor having a first terminal connected to a voltage source having a positive voltage and a second terminal connected to the base of the multi-emitter transistor;

a second resistor having a first terminal connected to the voltage source and a second terminal; and a first transistor having a base connected to the collector of the multi-emitter transistor, a collector connected to the second terminal of the second resistor and electrically coupled to an output port for outputting logic "0" or "1" responsive to the first and second input signals and the control signal, and an emitter electrically coupled to ground.

23. The programmable logic cell of claim 22, wherein the magnetic diode is formed of a magnetic semiconductor layer and a non-magnetic semiconductor layer.

24. The programmable logic cell of claim 23, wherein the non-magnetic semiconductor layer comprises an n-type doped III-V compound containing an element of Group III and an element of Group V.

25. The programmable logic cell of claim 24, wherein the non-magnetic semiconductor layer comprises n-type doped InAs.

26. The programmable logic cell of claim 23, wherein the magnetic semiconductor layer comprises a p-type doped III-Mn-V compound containing an element of Group III, Manganese (Mn) and an element of Group V.

27. The programmable logic cell of claim 26, wherein the magnetic semiconductor layer comprises p-type doped InMnAs.

28. The programmable logic cell of claim 22, further comprising:

a third resistor having a first terminal connected to the voltage source and a second terminal;

a fourth resistor having a first terminal connected to the emitter of the first transistor and a second terminal connected to the ground;

a second transistor having a base connected to the collector of the first transistor, a collector connected to the second terminal of the third resistor, and an emitter;

a third transistor having a base connected to the emitter of the first transistor, a collector connected to the output port, and an emitter connected to the ground; and a diode having an anode connected to the emitter of the second transistor and a cathode connected to the collector of the third transistor.

29. The programmable logic cell of claim 22, being a logic NAND gate.

30. The programmable logic cell of claim 22, being a logic AND gate when a magnetic field is applied to the magnetic diode.

31. A programmable logic apparatus, comprising at least one reprogrammable logic cell of claim 22.

* * * * *